(12) United States Patent
Hashimoto

(10) Patent No.: US 11,644,179 B2
(45) Date of Patent: May 9, 2023

(54) LIGHT EMITTING DEVICE

(71) Applicant: NICHIA CORPORATION, Anan (JP)

(72) Inventor: Takuya Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/476,941

(22) Filed: Sep. 16, 2021

(65) Prior Publication Data
US 2022/0090757 A1    Mar. 24, 2022

(30) Foreign Application Priority Data

Sep. 18, 2020    (JP) .............................. JP2020-157426

(51) Int. Cl.
| F21V 5/00 | (2018.01) |
|---|---|
| F21V 5/04 | (2006.01) |
| F21Y 113/10 | (2016.01) |
| F21Y 103/10 | (2016.01) |

(52) U.S. Cl.
CPC .............. F21V 5/04 (2013.01); *F21Y 2103/10* (2016.08); *F21Y 2113/10* (2016.08)

(58) Field of Classification Search
CPC .... F21V 5/04; F21Y 2115/30; F21Y 2113/10; F21Y 2103/10; H01S 5/4093; H01S 5/02253; G03B 21/2033; G03B 2215/0567
See application file for complete search history.

(56) References Cited

U.S. PATENT DOCUMENTS

| 2001/0050933 | A1  | 12/2001 | Takahashi et al. |
|---|---|---|---|
| 2003/0031217 | A1  | 2/2003 | Ariyoshi |
| 2012/0140186 | A1  | 6/2012 | Kuwata |
| 2013/0327966 | A1  | 12/2013 | Fidler et al. |
| 2013/0329021 | A1  | 12/2013 | Fidler et al. |
| 2015/0048147 | A1  | 2/2015 | Ide et al. |
| 2016/0025298 | A1* | 1/2016 | Reitterer .................... F21V 5/04 362/231 |
| 2017/0067609 | A1* | 3/2017 | Ichikawa ................. F21S 41/18 |
| 2020/0185877 | A1  | 6/2020 | Kawaguchi et al. |

FOREIGN PATENT DOCUMENTS

| JP | H03-112184 A | 5/1991 |
|---|---|---|
| JP | 2001-229570 A | 8/2001 |
| JP | 2002-057411 A | 2/2002 |
| JP | 2003-086882 A | 3/2003 |
| JP | 2005-012105 A | 1/2005 |
| JP | 2011-048021 A | 3/2011 |

(Continued)

*Primary Examiner* — Y M. Quach Lee
(74) *Attorney, Agent, or Firm* — Foley & Lardner LLP

(57) ABSTRACT

A light emitting device includes: a lens member having at least one lens surface; a submount; and a plurality of light emitting elements arranged in a row on an upper face of the submount, including a first light emitting element configured to emit first light having an emission peak at a first wavelength and a second light emitting element configured to emit second light having an emission peak at a second wavelength from a second light emission point, the second wavelength being different from the first wavelength, and the second light emission point being located farther from the lens member than a first plane that is perpendicular to an optical axis of the lens surface and that passes through the first light emission point.

10 Claims, 8 Drawing Sheets

(56) References Cited

FOREIGN PATENT DOCUMENTS

| | | |
|---|---|---|
| JP | 2011-165715 A | 8/2011 |
| JP | 2011-186175 A | 9/2011 |
| JP | 2014-511506 A | 5/2014 |
| JP | 2014-511507 A | 5/2014 |
| JP | 2017-147420 A | 8/2017 |
| WO | WO-2013/146313 A1 | 10/2013 |
| WO | WO-2018/003156 A1 | 1/2018 |

* cited by examiner

LIGHT EMITTING DEVICE

CROSS-REFERENCE TO RELATED APPLICATION

This application claims priority to Japanese Patent Application No. 2020-157426, filed on Sep. 18, 2020, the disclosure of which is hereby incorporated by reference in its entirety.

BACKGROUND

The present disclosure relates to a light emitting device.

Light emitting devices have been known in which multiple component elements are mounted in a package. Such multiple component elements may include a plurality of light emitting elements, for example. Other than light emitting elements, they may include Zener diodes, thermistors, or photodiodes, etc., for example.

For instance, Japanese Patent Publication No. 2017-147420 discloses a light emitting device that includes a submount, a plurality of laser diodes disposed on an upper face of the submount, and a single collimator lens that collimates the laser lights respectively emitted from the respective laser diodes. Because the plurality of light emitting elements are mounted in the package, a small-sized light emitting device can be realized.

SUMMARY

An objective of the present disclosure is to provide a light emitting device in which a plurality of light emitting elements are mounted so that light will be emitted from the light emitting elements at accurately controlled positions.

According to one embodiment, a light emitting device includes: a lens member having at least one lens surface, a plurality of light emitting elements, and a submount. The plurality of light emitting elements include a first light emitting element and a second light emitting element. The first light emitting element is configured to emit first light having an emission peak at a first wavelength from a first light emission point. The second light emitting element is configured to emit second light having an emission peak at a second wavelength from a second light emission point. The second wavelength is different from the first wavelength. The second light emission point is located farther from the lens member than a first plane that is perpendicular to an optical axis of the at least one lens surface and that passes through the first light emission point. The submount has an upper face on which the plurality of light emitting elements are arranged in a row. In a top view of the upper face of the submount as viewed from a normal direction thereof, inside a region surrounded by the first plane, a second plane that is perpendicular to the optical axis of the at least one lens surface and that passes through the second light emission point, a first line that is parallel to the optical axis of the at least one lens surface and that passes through the first light emission point, and a second line that is parallel to the optical axis of the at least one lens surface and that passes through the second light emission point, an outer edge of the upper face of the submount passes through a point that is farther from the lens member than the first plane and that is closer to the lens member than the second plane. The first light and the second light pass through the at least one lens surface.

According to certain embodiments of the present disclosure, there is provided a light emitting device in which a plurality of light emitting elements are mounted so that light will be emitted from the light emitting elements at accurately controlled positions.

DETAILED DESCRIPTION

Figure 1:
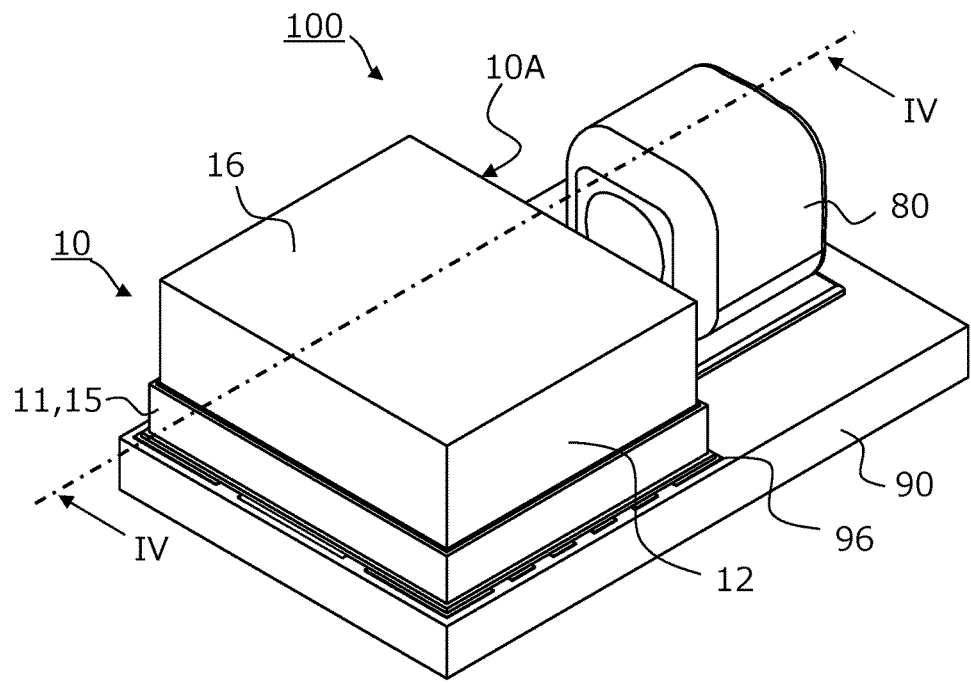
FIG. 1 is a perspective view of a light emitting device according to the present embodiment.

In the specification and claims herein, a polygonal shape, such as a triangle, quadrangle, or the like, is not limited to the polygonal shape in a mathematically strict sense, and includes any of those shapes subjected to processing such as cutting angles, chamfering, beveling, rounding, or the like. Similarly, a polygonal shape subjected to processing not only at a corner (end of a side), but also in the middle of a side will also be referred to as a polygonal shape. In other words, any polygon-based shape subjected to processing is included in a "polygon" disclosed in the specification and the claims herein.

This applies to not only polygons, but also any word that describes a specific shape, such as a trapezoidal, circular, recessed, or projected shape. This also applies when describing each side of a shape. In other words, even if a side is subjected to processing at a corner or at a portion between the corner, the "side" includes the processed portion. In the case of distinguishing a "polygon" or "side" that has not been processed from a processed shape, it will be expressed with the word "strict sense" added thereto, for example, a "strict sense quadrangle."

In the specification and claims herein, moreover, when there are multiple pieces of a certain component and a distinction must be made, an ordinal such as "first," "second," or the like might occasionally be added. For example, a claim may recite that "a light emitting element is disposed on a substrate," while the specification may state that "a first light emitting element and a second light emitting element are disposed on a substrate." The ordinals, such as "first" and "second," are merely used to distinguish two light emitting elements. There is no special meaning associated with the order of the ordinals. An element accompanied by the same ordinal might not refer to the same element between the specification and the claims. For example, in the case in which elements are specified by the words, "a first light emitting element," "a second light emitting element," and "a third light emitting element," in the specification, "a first light emitting element" and "a second light emitting element" recited in the claims might correspond to "a first light emitting element" and "a third light emitting element" in the specification. Furthermore, in the case in which the term, "a first light emitting element," is used, but the term, "a second light emitting element," is not used in claim 1, the invention according to claim 1 is sufficient if it includes one light emitting element, and the light emitting element is not limited to "a first light emitting element" as used in the specification; i.e., it can be "a second light emitting element" or "a third light emitting element" in the specification.

In the specification and claims herein, terms indicating directions or positions (e.g., "upper/upward," "lower/downward," "right/rightward," "left/leftward," "front," "rear," and other terms including these) might be used. These terms, however, are merely used for the purpose of making the relative directions or positions in the drawings being referenced more easily understood. As long as the relative relationship between the directions or the positions indicated with the terms such as "upper," "lower," or the like is the same as those in a referenced drawing, the absolute layout of the elements in drawings outside of the present disclosure, or actual products and manufacturing equipment outside of the present disclosure, does not have to be the same as that shown in the referenced drawing.

Note that the dimensions, dimensional ratio, shapes, spacing of arrangement, etc. of any component elements shown in a drawing may be exaggerated for ease of understanding. In order to avoid excessive complexity of the drawings, certain elements may be omitted from illustration.

Hereinafter, with reference to the drawings, embodiments of the present invention will be described. Although the embodiments illustrate specific implementations of the technological concepts of the present invention, the present invention is not limited to the described embodiments. The numerical values, shapes, materials, steps, and the order of the steps shown in the description of the embodiments are only examples, and various modifications are possible so long as there is no technical contradiction. In the following description, elements identified by the same name or reference numerals are the same or the same type of elements, and redundant explanations of those elements may be omitted.

Figure 2:
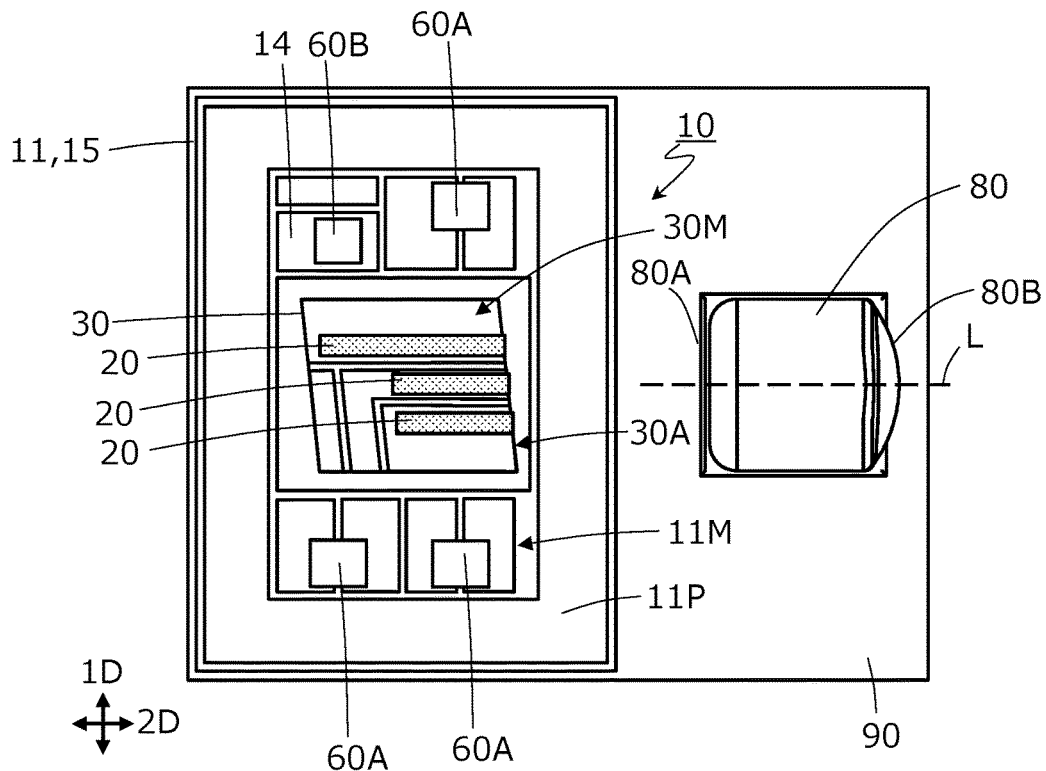
FIG. 2 is a top view of the light emitting device according to the present embodiment, from which a cap of a package is omitted.
Figure 3:
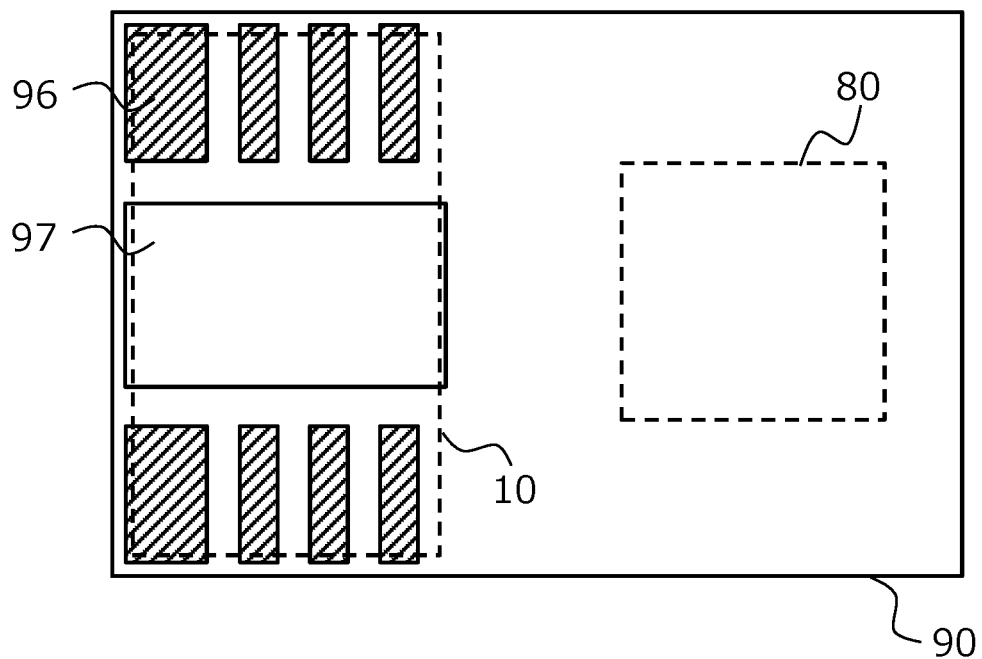
FIG. 3 is a top view of a substrate of the light emitting device according to the present embodiment.
Figure 4:
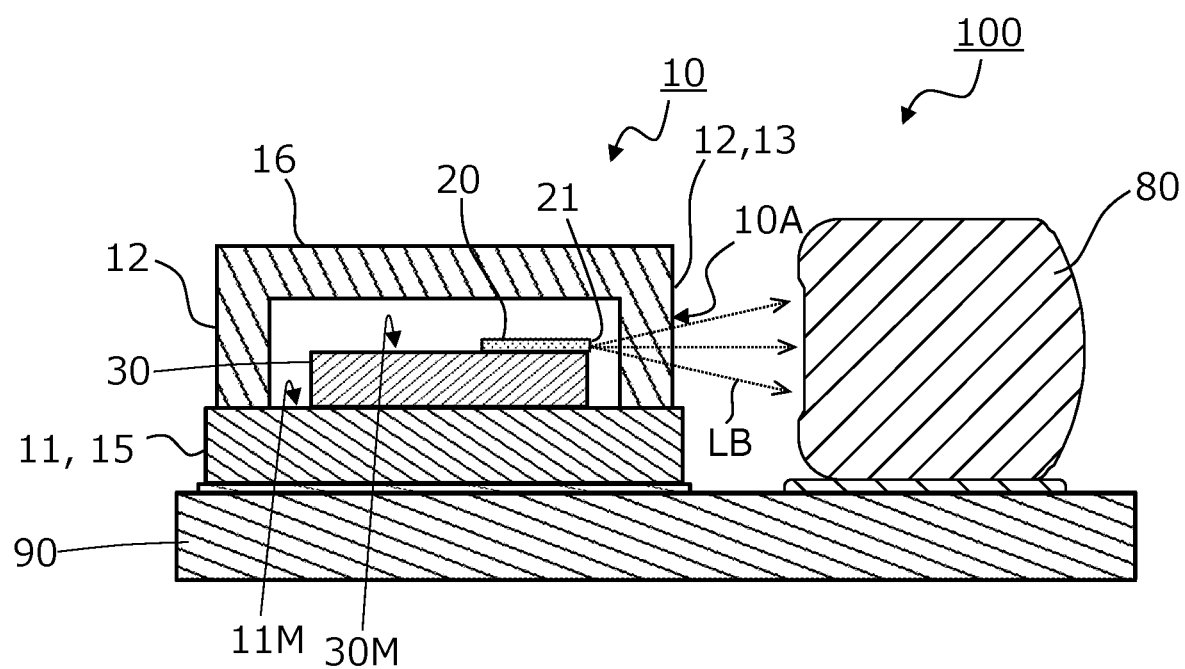
FIG. 4 is a cross-sectional view of the light emitting device taken along cross-sectional line IV-IV in FIG. 1.
Figure 5:
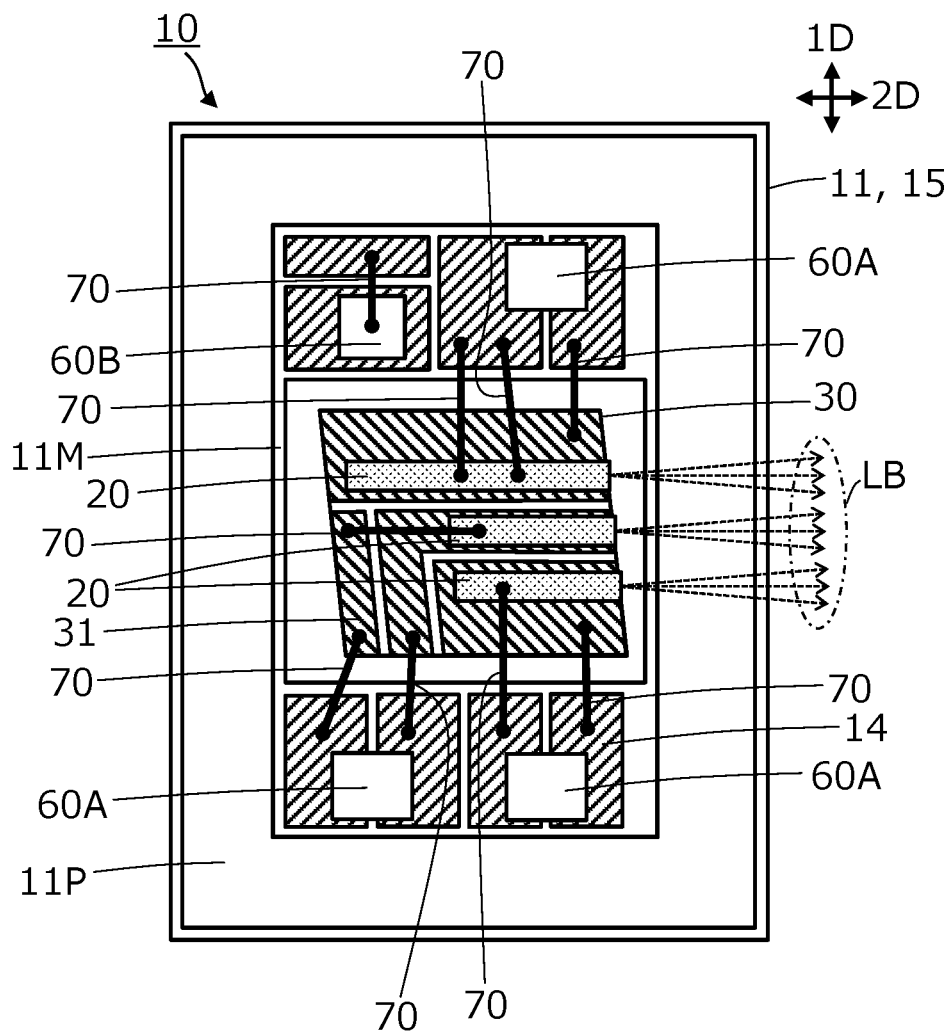
FIG. 5 is an enlarged top view of the inside of the package of the light emitting device according to the present embodiment.

A light emitting device 100 according to the present embodiment will be described. FIGS. 1 to 5 are diagrams showing an illustrative implementation of the light emitting device 100. FIG. 1 is a perspective view of the light emitting device 100 according to the present embodiment. FIG. 2 is a top view of the light emitting device 100, from which a cap 16 of a package 10 is omitted. FIG. 3 is a top view of a substrate 90. FIG. 4 is a cross-sectional view taken along cross-sectional line IV-IV in FIG. 1. FIG. 5 is an enlarged top view of the inside of the package 10. In FIG. 4 and FIG. 5, laser light LB emitted from each light emitting element 20 is indicated with dotted arrows. For convenience of illustration, the attached drawings include arrows 1D and 2D existing in a two-dimensional plane. Arrows 2D indicate a direction parallel to the direction that an optical axis L of the lens member 80 extends, whereas arrows 1D indicate a direction that is orthogonal to the direction of arrows 2D.

The light emitting device 100 according to the present embodiment includes multiple component elements, including: a package 10; a plurality of light emitting elements 20; one or more submounts 30; one or more protection elements 60A; a temperature measurement element 60B; one or more wires 70; a lens member 80; and a substrate 90.

In the illustrated example of the light emitting device 100, the following are disposed in the space inside the package 10: three light emitting elements 20, one submount 30, three protection elements 60A, one temperature measurement element 60B, and multiple wires 70. Divergent light that is emitted from each of the three light emitting elements 20 is laterally emitted from the package 10 to the outside, and thereafter collimated by the lens member 80.

First, each component element will be described.

(Package 10)

The package 10 includes: a base portion 11, which includes a mounting surface 11M and lateral wall portions 12 surrounding the mounting surface 11M. The mounting surface 11M of the base portion 11 is a region where other component elements are disposed. Moreover, the package 10 includes a substrate 15 and a cap 16 that is fixed to the substrate 15. The substrate 15 includes the base portion 11, whereas the cap 16 includes the lateral wall portions 12. In the following, the substrate 15 and the substrate 90 may be distinguished as the first substrate 15 and the second substrate 90, respectively.

In the illustrated example, the cap 16 includes: an upper-surface portion (lid) that faces the mounting surface 11M via some other component elements disposed on the mounting surface 11M, and a lateral-surface portion (frame) surrounding the other component elements disposed on the mounting surface 11M. The lateral-surface portion of the cap 16 includes the lateral wall portions 12. Note, however, that the lateral wall portions 12 do not need to be part of the cap 16. For example, the package 10 may alternatively be composed of one monolithic member including the base portion 11 and the lateral wall portions 12, and another member that includes the upper-surface portion.

In a top view of the mounting surface 11M of the base portion 11 as viewed from a normal direction thereof, the base portion 11 and the cap 16 both have a rectangular outer shape. Each of these outer shapes does not need to be rectangular, but may be any polygon other than a quadrangle, or any shape that includes a curve(s), a bend(s), or protrusions and depressions in a part or a whole thereof.

The base portion 11 includes one or more upper faces. The mounting surface 11M is included among the one or more upper faces of the base portion 11. The one or more upper faces of the base portion 11 include an upper face having a peripheral region 11P that surrounds one or more component elements disposed on the mounting surface 11M. In the illustrated example of the light emitting device 100, the mounting surface 11M and the aforementioned upper face having the peripheral region 11P are the same surface. Note that the mounting surface 11M and the peripheral region 11P may not be in the same plane, and may constitute different upper faces that are higher or lower in level, for example.

The peripheral region 11P is a region to which the cap 16 is bonded. In a top view, the peripheral region 11P is provided between the outer shape of the base portion 11 and a mounting region of the mounting surface 11M (i.e., a region where the multiple component elements are to be disposed). In the illustrated example of the light emitting device 100, in a top view, the mounting region of the mounting surface 11M is approximately rectangular, and the peripheral region 11P presents a rectangular annular shape surrounding the mounting region. To an upper face of the peripheral region 11P, a lower face of the lateral-surface portion of the cap 16 is bonded. A metal film for bonding with the cap 16 may be disposed in the peripheral region 11P.

As is illustrated in FIG. 4, the package 10 includes a light-transmissive region 13, which is a region that transmits light. Moreover, the package 10 has a light extraction face 10A, which includes the light-transmissive region 13. The light extraction face 10A is one face among the one or more outer lateral surfaces included in the lateral wall portions 12 of the package 10. When it is said that a region is of "light-transmissive" nature, it is meant that the subject has a transmittance of 80% or more with respect to a main portion of light entering the region.

The one or more outer lateral surfaces of the package 10 may also be light-transmissive in regions other than the light-transmissive region 13. Moreover, the package 10 may partially include a non-light-transmissive region (i.e., a region that does not transmit light). It is not necessary for all of the lateral wall portions 12 of the package 10 to be light-transmissive. In the illustrated example, the package 10 has four outer lateral surfaces of a rectangle, all of which are light-transmissive, but there exists only one light extraction face 10A.

The cap 16 may be entirely formed of a light-transmissive material, or only its lateral-surface portion may be formed of a light-transmissive material. One portion including the light extraction face 10A may be formed of a first light-transmissive material, while other portions may be formed of a second light-transmissive material or a non-light-transmissive material.

The cap 16 may be a monolithic piece composed of the upper-surface portion and the lateral-surface portion. For example, from a light-transmissive material such as glass, plastic, or quartz, a processing technique such as molding or etching may be utilized to produce a cap 16 having a desired shape e.g., a box shape. The cap 16 may be formed by bonding together an upper-surface portion (lid) and a lateral-surface portion (frame) that were separately formed by using different materials as their respective main materials. For example, the main material of the upper-surface portion may be monocrystalline or polycrystalline silicon, while the main material of the lateral-surface portion may be glass. Example dimensions of the cap 16 may be as follows: its height is not less than 0.6 mm and not more than 2.5 mm; and, in a top view, one side of its rectangular outer shape has a length of not less than 1.2 mm and not more than 8 mm. Alternatively, example dimensions of the cap 16 may be as follows: its height is not more than 2 mm; and, in a top view, one side of its rectangular outer shape has a length of not more than 4 mm.

In the illustrated example of the light emitting device 100, the light extraction face 10A is perpendicular to the directions in which the mounting surface 11M extends. As used herein, being "perpendicular" admits of a difference within ±5 degrees. Moreover, the light extraction face 10A does not need to be perpendicular to the directions in which the mounting surface 11M of the base portion 11 extends, and may be inclined therefrom.

Wiring regions 14 are provided on the mounting surface 11M. In FIG. 5, instead of indicating all wiring regions with the numeral "14," all wiring regions are hatched in the same directions. Through via holes extending inside the base portion 11, the wiring regions 14 may be electrically connected to wiring regions provided on the lower face of the base portion 11. Without being limited to the lower face of the base portion 11, the wiring regions (to be electrically connected to the wiring regions 14) may be provided on any other external surface of the base portion 11 (e.g., an upper face or outer lateral surfaces) that is located outside of the mounting region of the mounting surface 11M. The wiring regions 14 may be a patterned film or layer that is formed of an electrical conductor, e.g., a metal.

The wiring regions 14 include, in a top view: one or more wiring regions 14 that are disposed on one side from a central region of the mounting region of the mounting surface 11M; and one or more wiring regions 14 that are provided on the other (opposite) side from the central region.

The wiring regions 14 may include, in a top view: wiring regions 14 that are arranged along one direction with interspaces between one another; and wiring regions 14 that are arranged along a direction that is perpendicular to the one direction with interspaces between one another.

The wiring regions 14 may include multiple sets of wiring regions 14, where each set consists of two wiring regions 14 constituting a pair. The two wiring regions 14 constituting one set are electrically connected to one component element, and are utilized to receive power supplied from outside of the package 10. In the example of FIG. 5, a pair of wiring regions 14 that are electrically connected to each protection element 60A are arranged along the direction of arrows 2D, while a pair of wiring regions 14 that are electrically connected to the temperature measurement element 60B are arranged along the direction of arrows 1D, which is perpendicular to direction 2D.

The wiring regions 14 may include, in a top view: one or more sets of wiring regions 14 that are arranged along one direction; and one or more sets of wiring regions 14 that are arranged along a direction that is perpendicular to the one direction.

In a top view, one or more sets of wiring regions 14 that are arranged along one direction and one or more sets of wiring regions 14 that are arranged along a direction that is perpendicular to the one direction may be disposed on one side of a central region of the mounting region of the mounting surface 11M.

The first substrate 15 may be formed of ceramic as a main material. Examples of ceramics to be used for the first substrate 15 include aluminum nitride, silicon nitride, aluminum oxide, and carbon nitride.

In the present embodiment, the first substrate 15 may be composed of a ceramic substrate that includes metal vias inside, for example. The first substrate 15 preferably contains a material that has better heat-releasing property than that of ceramics (i.e., a material of high thermal conductivity) in portions that are in thermal contact with any component elements that may generate heat. Examples of such materials may include copper, aluminum, iron, copper molybdenum, copper tungsten, and copper-diamond composite materials.

(Light Emitting Element 20)

An example of a light emitting element 20 is a semiconductor laser element. The light emitting element 20 may have a rectangular outer shape in a top view. In the case where the light emitting element 20 is an end-face emitting type semiconductor laser element, a lateral surface that meets one of the two shorter sides of the rectangle is an emission end face through which light is emitted (light-exiting surface 21). In this example, an upper face and a lower face of the light emitting element 20 each have a greater area than that of the light-exiting surface 21.

The light emitting element 20 according to the present embodiment is single-emitter (i.e., having one emitter). Note that the light emitting element 20 may be multi-emitter (i.e., having two or more emitters). In the case where the light emitting element 20 is a semiconductor laser element having multiple emitters, one common electrode may be provided on one of the upper face and the lower face of the light emitting element 20, and electrodes corresponding to the respective emitters may be provided on the other one of the upper face and the lower face.

The light that is emitted from the light-exiting surface 21 of the light emitting element 20 is divergent light having some spread. Alternatively, the light may not be divergent light. In the case where a semiconductor laser element is used for the light emitting element 20, the divergent light (laser light) that is emitted from the semiconductor laser element creates a far field pattern (hereinafter referred to as "FFP") of an elliptical shape at a face that is parallel to the light-exiting surface 21. An FFP refers to the shape, or optical intensity distribution, of emitted light at a position away from the light-exiting surface.

Light that passes through the center of the elliptical shape of an FFP, i.e., light having a peak intensity in the optical intensity distribution of the FFP, will be referred to as "light traveling on an optical axis." Moreover, the optical path of light traveling on an optical axis will be referred to as "the optical axis" of that light. In the optical intensity distribution of an FFP, light having an intensity that is $1/e^2$ or greater with respect to the peak intensity value may be referred to as the "main portion" of light.

In the elliptical shape of an FFP of light that is emitted from the light emitting element 20 being a semiconductor laser element, the minor axis direction of the ellipse will be referred to the slow-axis direction of the FFP, and its major axis direction will be referred to as the fast-axis direction of the FFP. The plurality of layers that compose the semiconductor laser element (including an active layer) are layered in the fast-axis direction of the FFP.

Based on the optical intensity distribution of an FFP, an angle corresponding to the full width at half maximum of the optical intensity distribution is defined as an angle of spread of the light from the semiconductor laser element. An angle of spread of light along the fast-axis direction of the FFP will be referred to as an "angle of spread along the fast-axis direction," whereas an angle of spread of light along the slow-axis direction of the FFP will be referred to as an "angle of spread along the slow-axis direction."

As the light emitting element 20, for example, a semiconductor laser element emitting blue light, a semiconductor laser element emitting green light, a semiconductor laser element emitting red light, or the like may be adopted. Semiconductor laser devices emitting any other colors of light may also be used.

Herein, blue light refers to light that falls within an emission peak wavelength range from 420 nm to 494 nm. Green light refers to light that falls within an emission peak wavelength range from 495 nm to 570 nm. Red light refers to light that falls within an emission peak wavelength range from 605 nm to 750 nm.

Examples of semiconductor laser elements emitting blue light or semiconductor laser elements emitting green light may be semiconductor laser elements containing a nitride semiconductor. As the nitride semiconductor, for example, GaN, InGaN, or AlGaN may be used. Examples of semiconductor laser elements emitting red light may be those containing an InAlGaP-based, GaInP-based, GaAs-based, or AlGaAs-based semiconductor.

(Submount 30)

An example shape of the submount 30 according to the present embodiment is a hexahedron. The submount 30 has an upper face 30M, on which other component elements may be disposed, and a lower face located on the opposite side from the upper face 30M. Each of the upper face 30M and the lower face may function as a bonding surface. The distance between the upper face 30M and the lower face, i.e., the thickness of the submount, is shorter than the distance between the other two opposing faces. In a top view of the upper face 30M of the submount 30 as viewed from a normal direction thereof, outer edges of the upper face 30M of the submount 30 may present the shape of a parallelogram, for example. However, as will be described later, the shape presented by the outer edges is not limited to a parallelogram. The submount 30 may be formed of aluminum nitride, or carbon nitride. A metal film for bonding purposes is provided on a bonding surface (i.e., the upper face 30M or the lower face).

On the upper face 30M of the submount 30, wiring regions 31 to be electrically connected to other component elements are provided. In FIG. 5, instead of indicating all wiring regions with the numeral "31," all wiring regions are hatched in the same directions.

(Protection Element 60A)

The protection elements 60A are circuit elements to prevent certain devices (e.g., a light emitting element 20) from being broken by an excessive current flowing into it. A typical example of a protection element 60A is a voltage regulating diode such as a Zener diode. As a Zener diode, a Si diode may be adopted.

(Temperature Measurement Element 60B)

The temperature measurement element 60B is a device used as a temperature sensor for measuring the ambient temperature. As the temperature measurement element 60B, a thermistor may be used, for example.

(Wire 70)

Each wire 70 is formed of an electrical conductor having a linear shape, both ends of which serve as bonding sites. In other words, the wire 70 has, at both ends of its linear body, bonding portions for bonding to other component elements. The wire 70 may be a metal wire, for example. Examples of metals include gold, aluminum, silver, and copper.

(Lens Member 80)

The lens member 80 is formed so as to have at least one lens surface (i.e., one or more lens surfaces). The lens member 80 collimates light incident thereon. For example, the one or more lens surfaces are to be designed so that, when light diverging from its focal point is incident thereon, the divergent light is converted into collimated light through refraction, and this converted light is then emitted from the lens member 80. Each lens surface may be spherical or aspherical. A lens surface(s) may be formed on the surface at the light-entering side of the lens member 80 and/or the surface at the light-exiting side of the lens member 80. An optical film(s) (e.g., an antireflection coating or protective film(s)) may be provided on the surface at the light-entering side of the lens member 80 and/or the surface at the light-exiting side of the lens member 80. In the exemplary lens member 80 shown in FIG. 2, a concave lens surface 80A is formed on the light-entering side, and a convex lens surface 80B is formed on the light-exiting side. Note that a plurality of lens surfaces may be formed on the light-entering surface; that is, the lens member 80 may have one or more lens surfaces formed on the light-entering surface. Note that a plurality of lens surfaces may be formed on the light-exiting surface; that is, the lens member 80 may have one or more lens surfaces formed on the light-exiting surface.

The lens member 80 may be formed of a light-transmissive material, e.g., glass or plastic. Although the portion of the lens member 80 through which light is not transmitted may have any arbitrary shape, it preferably has a shape that allows the lens member 80 to be fixed to other component elements. In the exemplary lens member 80 shown in FIG. 2, the optical axis L and the lower face of the lens member 80 are parallel. The lower face of the lens member 80 has a flat region, which may function as a bonding region.

(Second Substrate 90)

In the example shown in FIG. 3, the second substrate 90 has wiring regions 96. In FIG. 3, the wiring regions 96 provided on the second substrate 90 are similarly hatched. The wiring regions 96 of the second substrate 90 are electrically connected to wiring regions that are provided on the lower face of the second substrate 90. Without being limited to the lower face of the second substrate 90, the wiring regions (to be electrically connected to the wiring regions 96) may be provided on any other external surface of the second substrate 90 (e.g., an upper face or outer lateral surfaces).

The second substrate 90 can be formed by using a ceramic as a main material. Examples of ceramics to be used for the second substrate 90 include aluminum nitride, silicon nitride, aluminum oxide, and carbon nitride.

The second substrate 90 preferably includes a portion that is formed of a material that has better heat-releasing property than that of ceramics (i.e., a material of high thermal conductivity). In the exemplary second substrate 90 shown in FIG. 3, the second substrate 90 includes a heat-conductive member 97 embedded inside. The heat-conductive member 97 fills an opening penetrating from the upper face to the lower face of the second substrate 90. The heat-conductive member 97 is provided in a region facing the lower face of the first substrate 15. The heat-conductive member 97 may be formed of copper, aluminum, iron, copper molybdenum, copper tungsten, or a copper-diamond composite material, for example. The heat-conductive member 97 may have any appropriate shape. In the exemplary second substrate 90 shown in FIG. 3, the wiring regions 96 are disposed in two groups constituting of an upper group and a lower group, and the heat-conductive member 97 is disposed in a central region that is interposed between the two groups of the wiring regions 96.

The second substrate 90 is structured so as to support the component elements of the light emitting device 100, and to be capable of electrically connecting with electronic parts included in such component elements. The second substrate 90 may also support any elements, electronic parts, or optical parts other than the component elements of the light emitting device 100.

(Light Emitting Device 100)

Next, the light emitting device 100 will be described.

In the exemplary light emitting device 100 described below, each of the light emitting elements 20 is an end-face emitting type semiconductor laser element (laser diode).

In the light emitting device 100, the plurality of light emitting elements 20 are disposed inside the package 10. The light emitting elements 20 are disposed on the mounting surface 11M of the first substrate 15, and are surrounded by the lateral wall portions 12 of the package 10. Each light emitting element 20 is disposed on the mounting surface 11M via a submount 30.

The light emitting elements 20 are disposed so that their emission end faces are oriented toward the light extraction face 10A of the package 10. Moreover, the light emitting elements 20 are disposed in the central region of the mounting surface 11M. In a top view, the one or more wiring regions 14 that are disposed on one side as well as the other side of this central region do not overlap the optical path of light that is emitted from the light emitting elements 20 toward the light extraction face 10A.

In the light emitting device 100, the one or more protection elements 60A is disposed inside the package 10 while being disposed on the mounting surface 11M. The protection element(s) 60A is to be disposed on one or two wiring regions 14. In the illustrated example of the light emitting device 100, each protection element 60A is electrically connected to two wiring regions 14, each protection element 60A being disposed astride two wiring regions 14.

Each protection element 60A is disposed at a position that is closer to the peripheral region 11P of the package 10 than is the submount 30. Therefore, the distance from each protection element 60A to the lateral wall portions 12 is shorter than the distance from the protection element 60A to the submount 30.

The protection element(s) 60A is provided in order to protect the light emitting elements 20. In the light emitting device 100, one protection element is provided for one light emitting element 20. In other words, as many protection elements 60A as the light emitting elements 20 are provided.

In the example shown in FIG. 5, three protection elements 60A respectively corresponding to the three light emitting elements 20 are disposed on the mounting surface 11M of the base portion 11. More specifically, each protection element 60A is mounted on one pair of wiring regions 14 that are provided on the mounting surface 11M of the base portion 11. An anode of each protection element 60A is electrically connected to one of the pair of wiring regions 14, whereas a cathode of the protection element 60A is electrically connected to the other one of the pair of wiring regions 14.

One of a p-side electrode and an n-side electrode of each light emitting element 20 is electrically connected to a wiring region 31 provided on the upper face 30M of the submount 30. One end of a wire 70 is bonded to the wiring region 31, while the other end of this wire 70 is bonded to one of a pair of wiring regions 14 provided on the mounting surface 11M of the base portion 11. One end of another wire 70 is bonded to the other one of the p-side electrode and n-side electrode of the light emitting element 20, while the other end of this other wire 70 is bonded to the other one of the pair of wiring regions 14 provided on the mounting surface 11M of the base portion 11. This exemplary electrical interconnection allows a protection element 60A to be connected in parallel to the light emitting element 20.

The distance from a light emitting element 20 to the position at which a wire 70 for electrically connecting the light emitting element 20 is bonded to a wiring region 14 is shorter than the distance from the light emitting element 20 to the protection element 60A that is electrically connected to this wiring region 14. Also, in a top view, the distance from an outer edge of a wiring region 14 to the protection element 60A that is disposed in this wiring region 14 is shorter than the distance from an outer edge of the wiring region 14 to the wire 70 that is bonded to this wiring region 14. This allows the protection element 60A to be located close to the lateral wall portions 12, whereby the size of the package 10 can be reduced.

With reference to FIGS. 6 to 10 and FIGS. 11A, 11B, and 11C, the structure of the submount 30 and the arrangement of the plurality of light emitting elements 20 according to the present embodiment will be described in more detail.

Figure 6:
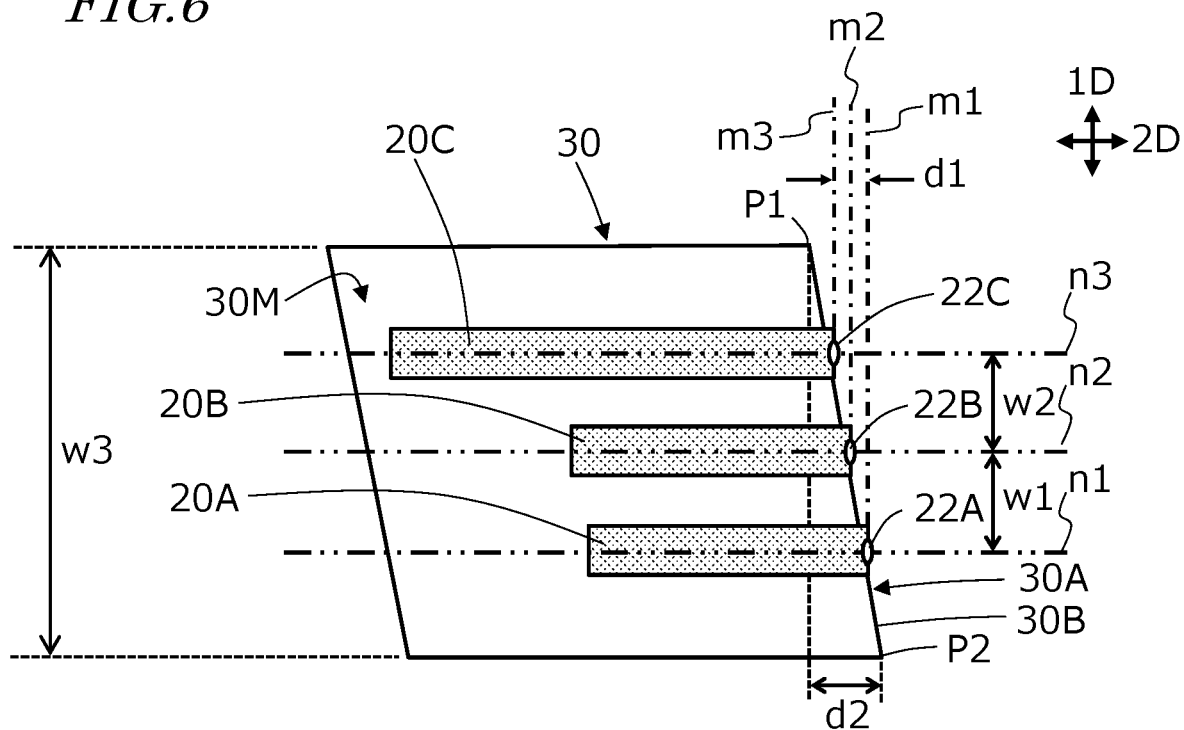
FIG. 6 is an enlarged view of the upper face of a submount, on which three light emitting elements are arranged.
Figure 7:
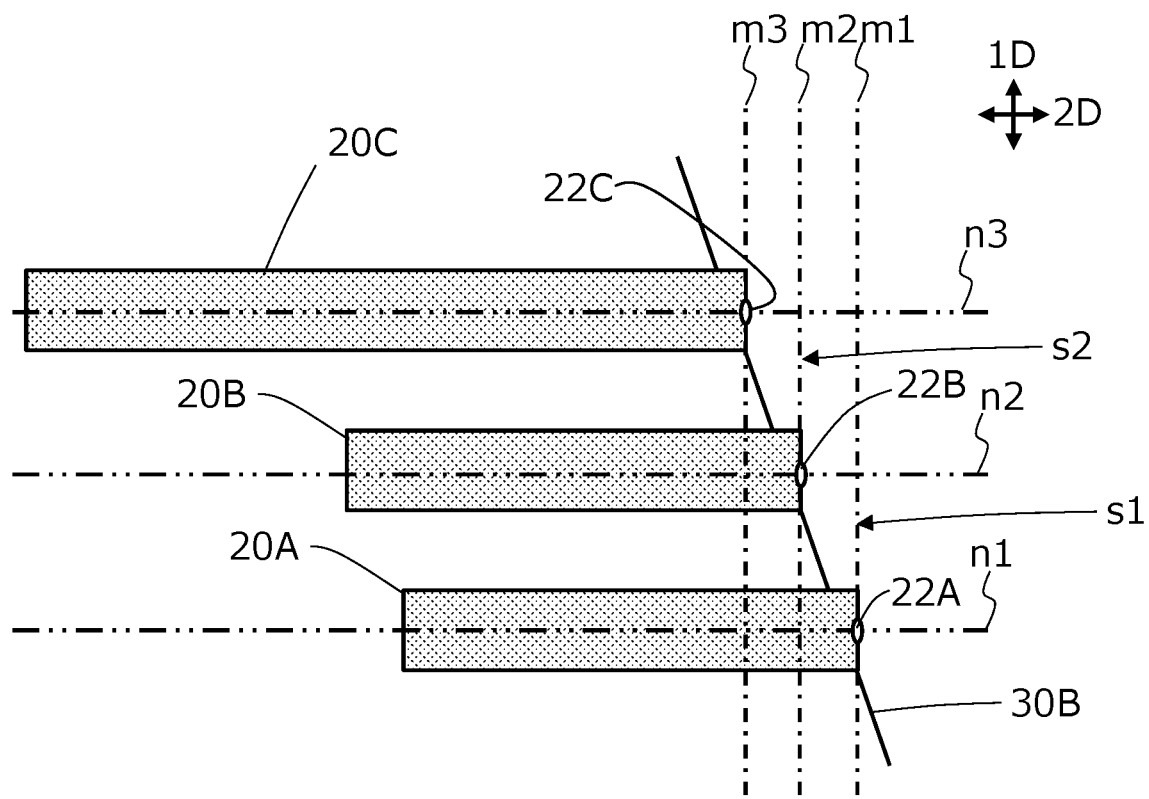
FIG. 7 is an enlarged plan view of the side at which the respective light-exiting surfaces of the three light emitting elements are located.

FIG. 6 is an enlarged view of the upper face 30M of the submount 30, on which three light emitting elements 20 are arranged. FIG. 7 is an enlarged top view of an outer edge of the submount 30 at which the respective light-exiting surfaces 21 of the three light emitting elements 20 are located.

In the illustrated example, the plurality of light emitting elements 20 are arranged in a row so that the respective light-exiting surfaces 21 are all oriented in the same direction. The plurality of light emitting elements 20 may be arranged in a row so that the respective light-exiting surfaces 21 are parallel to one another. Light emitted from the respective light-exiting surfaces 21 of the plurality of light emitting elements 20 travels toward the lateral surface of the package 10 in which the light extraction face 10A is included. However, the light-exiting surfaces 21 of the plurality of light emitting elements 20 do not need to be parallel to one another.

In the illustrated example, the plurality of light emitting elements 20 include three semiconductor laser elements 20A, 20B and 20C of different emission peak wavelengths. The emission peak wavelength of the semiconductor laser element 20A is shorter than the emission peak wavelength of the semiconductor laser element 20B, and the emission peak wavelength of the semiconductor laser element 20B is shorter than the emission peak wavelength of the semiconductor laser element 20C. The semiconductor laser element 20A emits first light having an emission peak at a first wavelength, and emits from a light emission point 22A that is located at the light-exiting surface. The semiconductor laser element 20B emits second light having an emission peak at a second wavelength that is different from the first wavelength, and emits from a light emission point 22B that is located at the light-exiting surface. The semiconductor laser element 20C emits third light having an emission peak at a third wavelength that is different from the first wavelength and the second wavelength, and emits from a light emission point 22C that is located at the light-exiting surface.

In the present embodiment, the first light is blue light; the second light is green light; and the third light is red light. In other words, the semiconductor laser element 20A emits blue light; the semiconductor laser element 20B emits green light; and the semiconductor laser element 20C emits red light. In the present embodiment, in a top view, the semiconductor laser element 20C emitting red light has a longer length along the optical axis direction of at least one lens surface of the lens member 80 than that of the semiconductor laser element 20B emitting green light or the semiconductor laser element 20A emitting blue light. Note that the optical axis of a lens surface of the lens member 80 may coincide with the optical axis L of the lens member 80. The output power of laser light can be adjusted through adjustments of this length; however, the length relationship is not limited to the above example. An implementation in which the three light emitting elements 20 are configured to emit light of three colors of RGB may be adopted for color-image displaying applications, for example. The colors of the light emitted from the respective light emitting elements 20 are not limited to these; depending on the application, non-visible light may also be used.

In the illustrated example, in a top view of the upper face 30M of the submount 30 as viewed from a normal direction thereof, a distance w1 between the light emission point 22A and the light emission point 22B along the direction of arrows 1D is e.g. not less than 100 µm and not more than 150 µm, and a distance w2 between the light emission point 22B and the light emission point 22C is e.g. not less than 100 µm and not more than 150 µm. The smaller the distances between light emission points are, the smaller the shape of the submount 30 along the direction 1D can be, thus allowing the size of the light emitting device 100 to be reduced. For ease of understanding, each light emission point is illustrated as an elliptical shape near the center of the light-exiting surface along the direction of arrows 1D; however, the present disclosure is not limited thereto. The light emission point may be shifted along the direction of arrows 1D from the center of the light-exiting surface in a top view.

Now, some imaginary planes and straight lines will be defined. A plane that is perpendicular to the optical axis L of at least one lens surface of the lens member 80 and that passes through the light emission point 22A of the semiconductor laser element 20A is referred to as a first plane. A plane that is perpendicular to the optical axis L of this lens surface and that passes through the light emission point 22B of the semiconductor laser element 20B is referred to as a second plane. A plane that is perpendicular to the optical axis L of this lens surface and that passes through the light emission point 22C of the semiconductor laser element 20C is referred to as a third plane. A straight line that is parallel to the optical axis L of this lens surface and that passes through the light emission point 22A of the semiconductor laser element 20A is referred to as a first line. A straight line that is parallel to the optical axis L of this lens surface and that passes through the light emission point 22B of the semiconductor laser element 20B is referred to as a second line. A straight line that is parallel to the optical axis L of this lens surface and that passes through the light emission point 22C of the semiconductor laser element 20C is referred to as a third line.

In FIG. 6 and FIG. 7, in a top view, the first to third planes are respectively shown by dot-dash lines m1, m2 and m3. Similarly, the first to third lines are respectively shown by double dot-dashed lines n1, n2 and n3. Hereinafter, the first to third planes will be respectively referred to as planes m1, m2 and m3, whereas the first to third lines will be respectively referred to as lines n1, n2 and n3.

The light emission point 22B of the semiconductor laser element 20B is located farther from the lens member 80 than is the plane m1. The light emission point 22C of the semiconductor laser element 20C is located farther from the lens member 80 than is the plane m2. Thus, along the direction of the optical axis L of the lens surface, the light emission point 22B of the semiconductor laser element 20B is set back from the light emission point 22A of the semiconductor laser element 20A, whereas the light emission point 22C of the semiconductor laser element 20C is set back from the light emission point 22B of the semiconductor laser element 20B. The amount of shift of each light emission point may be appropriately adjusted in accordance with the emission peak wavelengths of the light emitting elements, the distance between two adjacent light emission points, the optical characteristics (including the refractive index, etc.) of the lens member 80, and the like. In the present embodiment, the amount of shift of the light emission point 22C of the semiconductor laser element 20C relative to the light emission point 22A of the semiconductor laser element 20A along the direction of the optical axis L of the lens surface, i.e., the distance d1 between the plane m1 and the plane m3, may be e.g. not less than 50 μm and not more than 100 μm. For adjustment of light from the standpoint of optical control (e.g., reducing chromatic aberration and adjusting the optical path lengths of different colors of light), shifting of the light emission points will enable such adjustments without requiring any additional optical parts, thus preventing the number of parts from increasing.

In the light emitting device 100, the submount 30 to which the plurality of light emitting elements 20 are bonded is disposed inside the package 10. The submount 30 is bonded to the light emitting element 20 at one of its bonding surfaces, i.e., the upper face 30M. At the other (opposite) bonding surface, the submount 30 is bonded to the mounting surface 11M.

The submount 30 has the upper face 30M, on which the plurality of light emitting elements 20 are arranged in a row. In the illustrated example, the upper face 30M of the submount 30 has the shape of a parallelogram. Among the two pairs of parallel sides constituting the parallelogram, one pair of parallel sides are parallel to the optical axis L of at least one lens surface of the lens member 80. In the present embodiment, the parallelogram of the upper face 30M has a height w3 (length w3) of about 500 μm. Along the direction of the optical axis L (the direction of arrows 2D), the distance d2 from the vertices P1 to P2 of the parallelogram may be not less than 50 μm and not more than 100 μm.

As is illustrated in FIG. 7, in a top view of the upper face 30M of the submount 30 as viewed from a normal direction thereof, the outer edge 30B of the upper face 30M of the submount 30 passes through a point that is farther from the lens member 80 than is the plane m1 and that is closer to the lens member 80 than is the plane m2, inside the region s1 surrounded by the plane m1, the plane m2, the line n1, and the line n2. Furthermore, in a top view, the outer edge 30B of the upper face 30M of the submount 30 passes through a point that is farther from the lens member 80 than is the plane m2 and that is closer to the lens member 80 than is the plane m3, inside a region s2 surrounded by the plane m2, the plane m3, the line n2, and the line n3.

The submount 30 has a lateral surface 30A intersecting the upper face 30M and the upper face 30M. The lateral surface 30A is an end face of the submount 30 at which the light emission points of the light emitting elements 20 are located. The semiconductor laser element 20A is disposed so that its light emission point 22A protrudes from the outer edge 30B located at the boundary between the upper face 30M of the submount 30 and the lateral surface 30A. The semiconductor laser element 20B is disposed so that its light emission point 22B protrudes from the outer edge 30B. The semiconductor laser element 20C is disposed so that its light emission point 22C protrudes from the outer edge 30B.

The three semiconductor laser elements 20A, 20B and 20C are disposed on the submount 30 so that their three light emission points 22A, 22B and 22C are arranged along one of the four sides of the parallelogram of the upper face 30M. In a top view, the optical axis direction (i.e., the direction of arrows 2D) of at least one lens surface of the lens member 80 and the direction that the outer edge 30B of the submount 30 extends intersect at an angle that is not 90°. In other words, the lateral surface 30A of the submount 30 makes an angle that is not 90° with the inner lateral surface of the lateral wall portion 12 of the package 10. In the present embodiment, this inclination angle relative to the direction of arrows 1D may be determined based on the aforementioned amounts of shift of the light emission points and the distance between two adjacent light emitting elements. This tilt angle may be adjusted to a value in the range above 5° but not exceeding 20°, for example. Even if the amount of shift between light emission points is kept unchanged, increasing the inclination angle allows for reducing the distance between two adjacent light emitting elements, i.e., the distance between two light emission points.

The first light (blue light) emitted from the light emission point 22A of the semiconductor laser element 20A, the second light (green light) emitted from the light emission point 22B of the semiconductor laser element 20B, and the third light (red light) emitted from the light emission point 22C of the semiconductor laser element 20C each pass through at least one lens surface of the lens member 80. Moreover, the first light, the second light, and the third light pass through one lens surface of the lens member 80. The at least one lens surface of the lens member 80 collimates the first light, the second light, and the third light.

At least one of the first light, the second light, and the third light includes light traveling on the optical axis L of a lens surface of the lens member 80, while the other ones do not include any light traveling on the optical axis L of this lens surface. In the illustrated example, among the first light, the second light, and the third light passing through a lens surface of the lens member 80, the second light includes light traveling on the optical axis L of this lens surface, while the first light and the third light do not include any light traveling on the optical axis L of this lens surface. Moreover, the distance from the light emission point 22A of the first light to the optical axis L of this lens surface and the distance from the light emission point 22C of the third light to the optical axis L of this lens surface may be equal.

Figure 8:
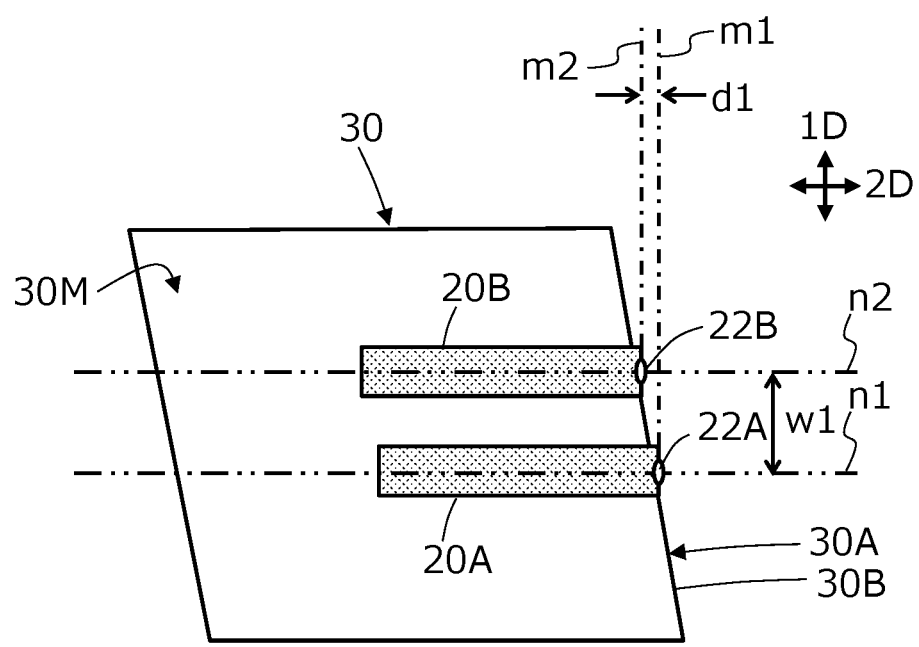
FIG. 8 is an enlarged view of the upper face of a submount having two light emitting elements arranged thereon.
Figure 9:
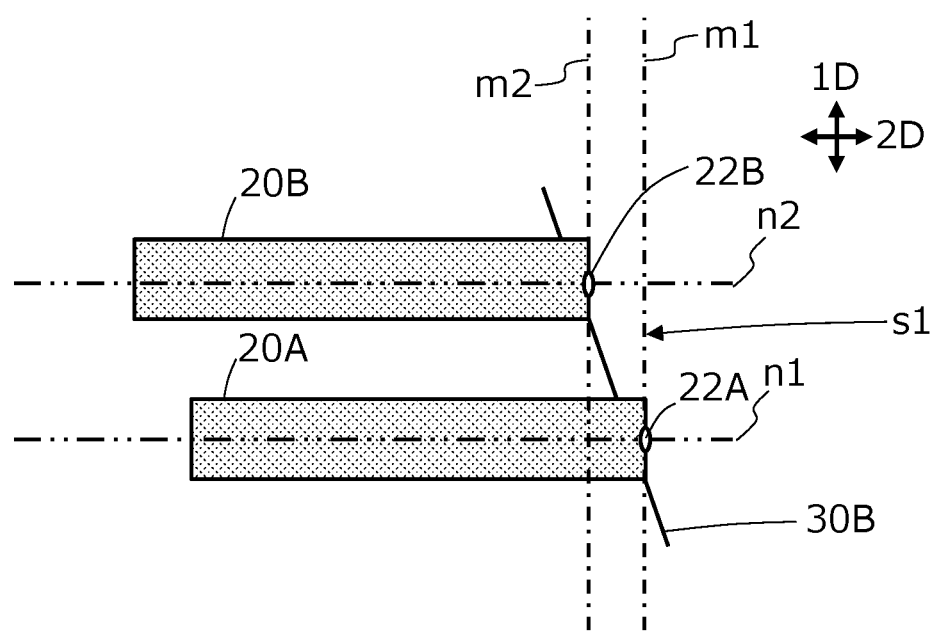
FIG. 9 is an enlarged plan view of the side at which the respective light-exiting surfaces of the two light emitting elements are located.

In the present embodiment, the number of light emitting elements 20 is not limited to three, but may two, or four or greater. FIG. 8 is an enlarged view of the upper face 30M of a submount 30 on which two light emitting elements 20 are arranged. FIG. 9 is an enlarged plan view of an outer edge of the submount 30 at which the respective light-exiting surfaces 21 of the two light emitting elements 20 are located.

In the illustrated example, the plurality of light emitting elements 20 include two semiconductor laser elements 20A and 20B of respectively different emission peak wavelengths. The emission peak wavelength of the semiconductor laser element 20A is shorter than the emission peak wavelength of the semiconductor laser element 20B. In the illustrated example, the semiconductor laser element 20A emits blue light, whereas the semiconductor laser element 20B emits green light. In other example combinations, the semiconductor laser element 20A may emit blue light and the semiconductor laser element 20B may emit red light; or, the semiconductor laser element 20A may emit green light and the semiconductor laser element 20B may emit red light.

In the illustrated example, in a top view, the distance w1 between the two light emission points 22A and 22B along a direction (i.e., the direction of arrows 1D) perpendicular to the direction of the optical axis L of the at least one lens surface (i.e., the direction of arrows 2D) may be e.g. not less than 100 μm and not more than 150 μm.

The light emission point 22B of the semiconductor laser element 20B is disposed farther from the lens member 80 than is the plane m1. Along the direction of the optical axis L of the lens surface, the light emission point 22B of the semiconductor laser element 20B is set back from the light emission point 22A of the semiconductor laser element 20A. In the illustrated example, along the direction of the optical axis L of the lens surface, the amount of shift of the light emission point 22B of the semiconductor laser element 20B relative to the light emission point 22A of the semiconductor laser element 20A, i.e., the distance d1 between the plane m1 and the plane m2, may be e.g. not less than 50 μm and not more than 100 μm.

As is illustrated in FIG. 9, in a top view of the upper face 30M of the submount 30 as viewed from a normal direction thereof, the outer edge 30B of the upper face 30M of the submount 30 passes through a point that is farther from the lens member 80 than is the plane m1 and that is closer to the lens member 80 than is the plane m2, inside the region s1 surrounded by the plane m1, the plane m2, the line n1, and the line n2.

The semiconductor laser element 20A is disposed so that its light emission point 22A protrudes from the outer edge 30B located at the boundary between the upper face 30M and the lateral surface 30A of the submount 30. The semiconductor laser element 20B is disposed so that its light emission point 22B protrudes from the outer edge 30B.

The two semiconductor laser elements 20A and 20B are disposed on the submount 30 so that their two light emission points 22A and 22B are arranged along one of the four sides of the parallelogram of the upper face 30M. In a top view, the direction of the optical axis L of at least one lens surface of the lens member 80 and the direction that the outer edge 30B extends intersect at an angle that is not 90°. In the present embodiment, this inclination angle relative to the direction of arrows 1D may be determined based on the aforementioned amounts of shift of the light emission points and the distance between two adjacent light emitting elements. This inclination angle may be adjusted to a value in the range more than 5° but 20° or less, for example.

The first light (blue light) emitted from the light emission point 22A of the semiconductor laser element 20A and the second light (green light) emitted from the light emission point 22B of the semiconductor laser element 20B each pass through one lens surface of the lens member 80. The one lens surface of the lens member 80 collimates the first light and the second light.

Neither the first light nor the second light includes any light traveling on the optical axis L of the at least one lens surface of the lens member 80. Alternatively, at least one of the first light and the second light may include light traveling on the optical axis L of the at least one lens surface of the lens member 80. In the illustrated example, however, neither the first light nor the second light passing through a lens surface of the lens member 80 includes any light traveling on the optical axis L of this lens surface.

When different wavelengths of light are incident on a lens surface so as to be subjected to an optical control such as collimation, chromatic aberration may arise. Note that chromatic aberration means an axial chromatic aberration where an image is formed by light at different positions along the optical axis direction depending on the light wavelength. Chromatic aberration can be reduced through adjustments made by shifting the light emission points of the plurality of light emitting elements 20 as in the light emitting device 100.

With the exemplary submount structure and the exemplary arrangement of a plurality of light emitting elements according to the present embodiment, the ratio of the distance d2 from the vertices P1 to P2 of the parallelogram to the height w3 (length w3) of the parallelogram, i.e., the inclination angle, can be adjusted on the basis of how much the light emission point of each light emitting element protrudes as well as the distance between two light emitting elements. Thus, based on the shape of the submount 30 that is adapted to the shifting light emission points, a portion of divergent light is less likely to strike the upper face of the. The light emitting device 100 according to the present embodiment can realize a light emitting device in which a plurality of light emitting elements are mounted so that light will be emitted from the light emitting elements at accurately controlled positions.

Figure 10:
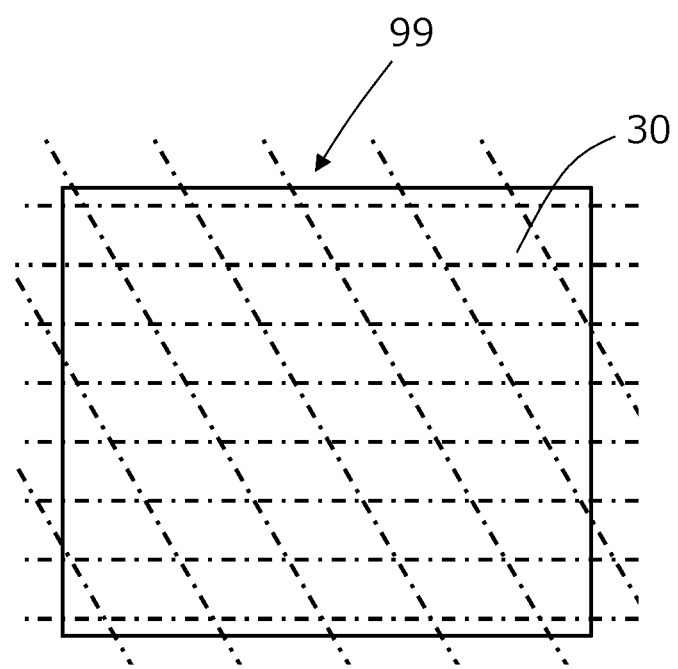
FIG. 10 is a schematic diagram showing how a plate-like submount substrate may be cut in an oblique direction.

Submounts can be singulated, as multiple pieces, from a plate-like submount substrate, and a plurality of submounts having an identical shape can be obtained from a single submount substrate. FIG. 10 is a top view schematic cut lines for cutting a plate-like submount substrate 99. As shown in FIG. 10, the plate-like submount substrate 99 may be cut and singulated along cut lines running in a direction parallel to an edge of the submount substrate and cut lines running in a direction that obliquely intersects the other direction, whereby a plurality of submounts can be obtained each having an upper face in the shape of a parallelogram. The cutting can be done by laser processing, for example. With this method, portions to be utilized as submounts will densely exist in the submount substrate, these being distinguished by linear cut lines. Adopting submounts having an upper face in the shape of a parallelogram will be advantageous also in terms of ease of manufacture.

Figure 11A:
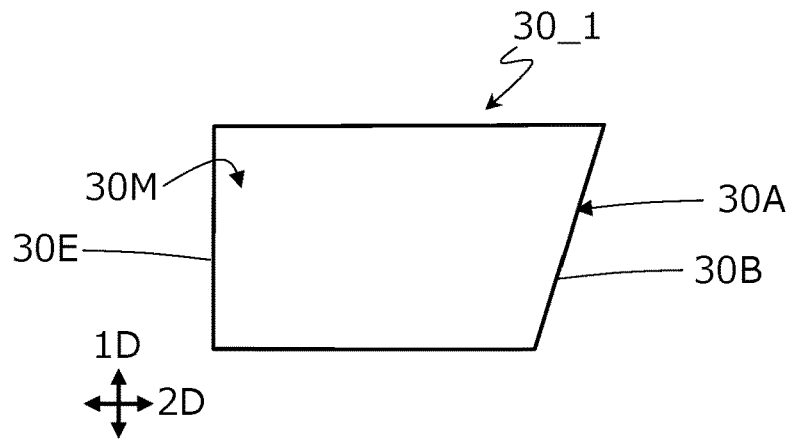
FIG. 11A is a top view of a submount 30_1 according to the present embodiment.
Figure 11B:
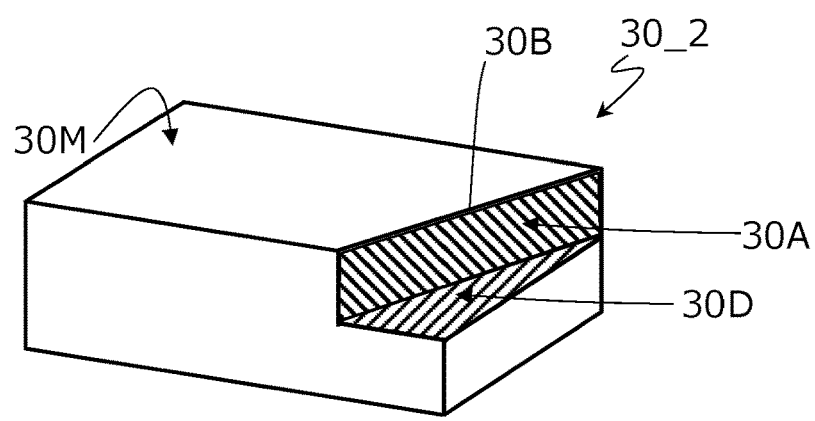
FIG. 11B is a perspective view of a submount 30_2 according to the present embodiment.
Figure 11C:
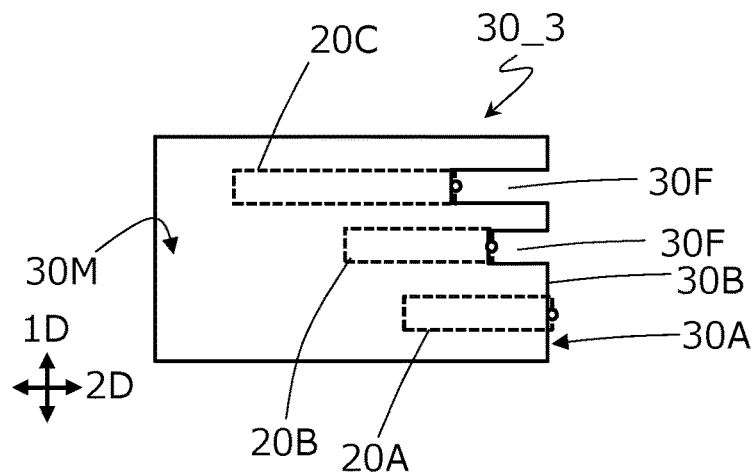
FIG. 11C is a top view of a submount 30_3 according to the present embodiment.

With reference to FIGS. 11A, 11B and 11C, some example structures of submounts according to the present embodiment will be described. FIG. 11A is a top view of a submount 30_1. FIG. 11B is a perspective view of a submount 30_2. FIG. 11C is a top view of a submount 30_3.

In the present disclosure, submount shapes other than parallelograms may also be used. Various shapes may be adopted under the given mounting conditions regarding the package, so long as the direction of the optical axis L of at least one lens surface of the lens member 80 and the direction that the outer edge 30B of the submount 30 extends intersect at an angle that is not 90° in a top view.

In the example of FIG. 11A, only the side (or an outer edge 30B) that is located at the boundary between an upper face 30M and a lateral surface 30A of the submount 30_1 is oblique, while the opposite side 30E to that side is not oblique. Thus, the upper face 30M of the submount 30 may have a trapezoidal shape.

In the example of FIG. 11B, only the side (or an outer edge 30B) that is located at the boundary between an upper face 30M and a lateral surface 30A of the submount 30_2 is oblique, while the opposite side to that side is not oblique. A difference between the example of FIG. 11A and the example of FIG. 11B is that the submount 30_2 has a step structure 30D on the side at which the light emission points of the light emitting elements are located. The step structure 30D has the lateral surface 30A on its inner surface. Thus, the end face of the submount at which the light emission points of the light emitting elements are located does not need to be flat. It is sufficient for the step structure 30D to have a size and shape with which a portion of divergent light is less likely to strike the upper face of the submount, so that a space in the shape of a triangular prism is maintained below the light emission points of the light emitting elements.

In the example of FIG. 11C, the submount 30_3 has an upper face 30M in an essentially rectangular shape. However, in a top view, one side of the rectangle constituting an outer edge of the submount 30 (i.e., an outer edge of the submount 30 on the side at which the light emission points of the light emitting elements are located) is recessed. These recesses create two recessed portions 30F on the lateral surface 30A of the submount 30. Each recessed portion 30F is a groove extending across the thickness of the submount 30. The depth of the recessed portion 30F extending along the optical axis direction of light traveling from the light-exiting surface 21 is adjusted based on the amounts of shift of the light emitting elements as aforementioned. Thus, in a top view, recessed portions 30F may be provided in the lateral surface 30A of the submount 30, instead of adopting a parallelogram shape. With such a structure, too, strike of laser light associated with protruding light emission points can be suppressed.

FIG. 1 to FIG. 5 are referred to again.

The plurality of light emitting elements 20 emit light sideways. From the light-exiting surface 21, each light emitting element 20 emits divergent light in a direction of one of the outer lateral surface(s) of the package 10 that serves as the light extraction face 10A. The light emitted from the light-exiting surface 21, traveling on its optical axis, proceeds in parallel to the mounting surface 11M. The light emitted from each light emitting element 20 is transmitted through the lateral wall portion 12 of the package 10, and exits sideways from the light-transmissive region 13. As the number of component elements disposed on the mounting surface 11M increases, the package 10 will have a larger outer shape. However, an increase in the outer shape could occur more significantly in the upper face than in a lateral surface. Given that the outer shape can be reduced more at a lateral surface than in the upper face, allowing light to be emitted sideways can keep the size of the surface defining the light extraction face 10A smaller.

In the light emitting device 100, the temperature measurement element 60B is disposed inside the package 10, on the mounting surface 11M. The temperature measurement element 60B is disposed on a wiring region 14, and is electrically connected to two wiring regions 14. The temperature measurement element 60B is provided in order to measure the temperature of the light emitting elements 20.

The distance from the temperature measurement element 60B to one of the light emitting elements 20 closest to this temperature measurement element 60B is shorter than the distance from a protection element 60A to one of the light emitting elements 20 closest to this protection element 60A. Because the temperature measurement element 60B is located close to the light emitting elements 20, the accuracy of temperature measurement for the light emitting elements 20 is improved.

When a protection element 60A is electrically connected to one set of wiring regions 14 that are arranged along one direction, the temperature measurement element 60B is to be electrically connected to one set of wiring regions 14 that are arranged along a direction that is perpendicular to that direction.

Multiple sets of wiring regions 14 to which multiple protection elements 60A are electrically connected are arranged along the same direction. In each single set of wiring regions 14 to which a protection element 60A is electrically connected, the two wiring regions 14 are arranged so that their distances from the submount 30 are approximately equal in a top view.

On the other hand, in one set of wiring regions 14 to which the temperature measurement element 60B is electrically connected, the two wiring regions 14 are disposed at different distances from the submount 30 in a top view, with the difference being equal to or greater than the width of the temperature measurement element 60B.

To the wiring regions 14 that are electrically connected to a protection element 60A, wires 70 are bonded for electrical connection with a corresponding light emitting element 20. On the other hand, no wire 70 for electrical connection with a light emitting element 20 is bonded to the wiring regions 14 that would be electrically connected to the temperature measurement element 60B. This is why the wiring regions 14 are arranged in their respective directions.

In the light emitting device 100, in a top view, each wire 70 connects a wiring region 14 of the package 10 and a corresponding light emitting element 20 on the light emitting element 20 side (i.e., the side including the opposite surface of the light emitting element 20 from the light-exiting surface 21) by using a straight line (running parallel to the light-exiting surface 21 of the light emitting element 20) as a boundary. This makes it easier to avoid the presence of the wire 70 in the optical path of light.

In the light emitting device 100, a closed space is sealed inside the package 10. By bonding the first substrate 15 and the cap 16 in a predetermined ambient, a hermetically-sealed closed space is created inside the package 10. By hermetically sealing the space in which the light emitting elements 20 are disposed, deteriorations in quality due to collection of dust can be suppressed. Note that the cap 16 may be omitted in the case where the entire light emitting device 100 is used in an environment or ambient in which deteriorations in quality due to collection of dust or moisture in the air are not expected. For example, when the entire light emitting device 100 is sealed in an enclosure, the light emitting elements 20 do not need to be covered by the cap 16.

In the light emitting device 100, the package 10 is mounted on the second substrate 90. Specifically, the first substrate 15 of the package 10 is mounted on the second substrate 90. Via the wiring regions 14 of the first substrate 15 and the wiring regions 96 of the second substrate 90, various electronic parts disposed on the mounting surface 11M may be electrically connected to circuitry outside the light emitting device 100.

In the light emitting device 100, the lens member 80 is mounted on the second substrate 90. Without being limited to the second substrate 90, for example, the lens member 80 may be mounted on a first substrate 15 that is set to the same size as the second substrate 90. The fact that the lens member 80 is located outside of the package 10 and not surrounded by the lateral wall portions 12 allows the package 10 to be reduced in size.

The lower face of the lens member 80 is lower than the mounting surface 11M. By bonding the lower face of the lens member 80 to the upper face of the second substrate 90, the lower face of the lens member 80 can be disposed lower than the mounting surface 11M. This arrangement allows the light emitted from the package 10 to be incident on the lens member 80 at a position lower than the plane containing the mounting surface 11M.

Light that has been emitted from the plurality of light emitting elements 20 and exited from the package 10 through the light-transmissive region 13 is incident on the lens member 80. The lens member 80 collimates and emits the incident light.

The center axis of light that is extracted from the light extraction face 10A is oriented in the same direction as the mounting surface 11M of the base portion 11 extends. The optical axis L of a lens surface of the lens member 80 through which light is emitted and the center axis of the light that is extracted from the light extraction face 10A are at the same height from the mounting surface 11M of the base portion 11.

The center axis of the light extracted from the light extraction face 10A is perpendicular to the light extraction face 10A. The optical axis L of the lens surface of the lens member 80 through which light is emitted is also perpendicular to the light extraction face 10A. As used herein, being "perpendicular" admits of a difference within ±5 degrees. Moreover, the center axis of light does not need to be perpendicular to the light extraction face 10A.

In the illustrated example of the light emitting device 100, the plurality of light emitting elements 20 are disposed inside the package 10. Light that has been emitted from the plurality of light emitting elements 20 and exited from the package 10 through the light-transmissive region 13 is incident on a lens surface on the light-entering side of the lens member 80, and is emitted through a lens surface on the light-exiting side. Light that is emitted from the lens surface on the light-exiting side has been collimated by the lens member 80. In the illustrated example of the light emitting device 100, light that has been emitted from three light emitting elements 20 and exited from the package 10 through the light-transmissive region 13 is incident on the lens surface on the light-entering side of the lens member 80, and each collimated to be emitted from the lens surface on the light-exiting side. Using a single lens surface to collimate and control the light from the plurality of light emitting elements 20 allows the lens member 80 to be smaller than in the case where a lens surface is separately provided for each light emitting element 20. This may contribute to reduce the size of the light emitting device 100.

Figure 12:
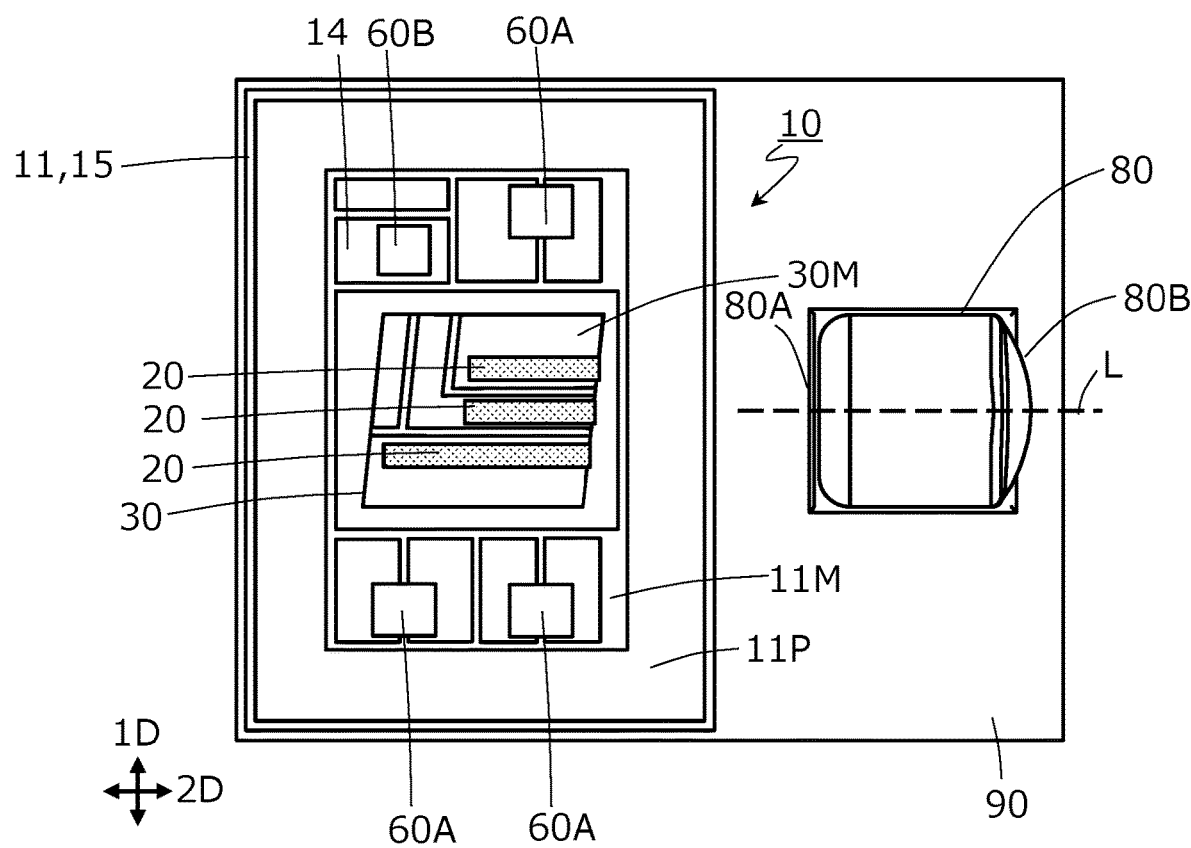
FIG. 12 is a top view showing a light emitting device according to a modified example of the present embodiment, from which a cap of a package is omitted.

In the example shown in FIG. 2, the submount 30 is disposed in the package 10 so that, in a top view, an outer edge of the submount 30 at which the light emission points of the light emitting elements 20 are located gets closer to the lateral wall portions 12 of the package 10 from the upper side to the lower side in the figure. The three light emitting elements 20 are disposed on the submount 30 in the order of RGB from the upper side, for example. Conversely, as shown in FIG. 12, the submount 30 may be disposed in the package 10 so that, in a top view, an outer edge of the submount 30 at which the light emission points of the light emitting elements 20 are located gets farther from the lateral wall portions 12 of the package 10 from the upper side to the lower side in the figure. In this case, the three light emitting elements 20 are disposed on the submount 30 in the order of BGR from the upper side, for example. It will be appreciated that such an example structure also falls within the scope of the present disclosure.

The present embodiment has illustrated an example where the semiconductor laser element 20A emits blue light, the semiconductor laser element 20B emits green light, and the semiconductor laser element 20C emits red light. However, the present disclosure is not limited to this. For example, the semiconductor laser element 20A may emit red light, the semiconductor laser element 20B may emit green light, and the semiconductor laser element 20C may emit blue light. In this case, the RGB order of semiconductor laser elements is reversed from the above-described example, so that, among the three light emission points 22A, 22B and 22C, the light emission point 22A of the semiconductor laser element 20A emitting red light protrudes the most, i.e., being closest to the lateral wall portions 12. Combining such an arrangement with an achromatic lens can reduce chromatic aberration. An achromatic lens has a structure in which a plurality of lenses with different optical characteristics are attached together, and is generally used to correct for chromatic aberration. For example, in the case where the red laser light diverges more in the thickness direction of the submount than does blue or green laser light, the red laser light will be more likely to strike the substrate 90 or portions of the lens member 80 other than its lens surfaces than the blue or green laser light.

By ensuring that the light emission points of the red semiconductor laser element protrudes the most, strike of laser light can be effectively suppressed, but this protrusion may lead to a chromatic aberration. By utilizing an achromatic lens that is designed to correct for this chromatic aberration, it becomes possible to reduce chromatic aberration while suppressing strike of the red laser light.

Certain embodiments of the present invention have been described above, but light emitting devices according to the present invention are not limited to those described in the embodiments. In other words, the present invention is achievable without being limited to the outer shapes or structures of the light emitting devices disclosed in the embodiments. For example, a light emitting device according to the present invention can be one that has no protective device. The present invention is applicable without necessarily and fully including all of the disclosed constituent elements. For example, in the event that a certain component of a light emitting device included in any of the disclosed embodiments is not recited in the claims, the claimed invention may still be applicable in view of the design flexibility of a person of ordinary skill in the art for such a component through the use of an alternative, an omission, a shape change, a change in the materials employed, or the like.

Light emitting devices according to embodiments can be used for head-mounted displays, projectors, lightings, displays, and the like.

What is claimed is:

1. A light emitting device comprising:
   a lens member having at least one lens surface;
   a submount having an upper face and a lateral surface intersecting the upper face; and
   a plurality of light emitting elements arranged in a row on the upper face of the submount, the plurality of light emitting elements including:
      a first light emitting element configured to emit first light so as to pass through the at least one lens surface, the first light having an emission peak at a first wavelength from a first light emission point, and
      a second light emitting element configured to emit second light so as to pass through the at least one lens surface, the second light having an emission peak at a second wavelength from a second light emission point, the second wavelength being different from the first wavelength, and the second light emission point being located farther from the lens member than a first plane that is perpendicular to an optical axis of the at least one lens surface and that passes through the first light emission point; wherein:
   in a top view of the upper face of the submount as viewed from a normal direction thereof, inside a region surrounded by the first plane, a second plane that is perpendicular to the optical axis of the at least one lens surface and that passes through the second light emission point, a first line that is parallel to the optical axis of the at least one lens surface and that passes through the first light emission point, and a second line that is parallel to the optical axis of the at least one lens surface and that passes through the second light emission point, an outer edge of the upper face of the submount passes through a point that is farther from the lens member than the first plane and that is closer to the lens member than the second plane,
   the outer edge of the upper face of the submount is located at a boundary between the upper face and the lateral surface of the submount, the first light emitting element and the second light emitting element are disposed so that the first light emission point and the second light emission point protrude from the outer edge, and in the top view, a direction of the optical axis of the at least one lens surface and a direction in which the outer edge extends intersect at an angle that is not 90°.

2. The light emitting device of claim 1, wherein the at least one lens surface is configured to collimate the first light and the second light.

3. The light emitting device of claim 1, wherein the first and second light emitting elements are configured such that one of the first light and the second light includes light traveling on the optical axis of the at least one lens surface, and the other one of the first light and the second light does not include light traveling on the optical axis of the at least one lens surface.

4. The light emitting device of claim 1, wherein the upper face of the submount has a shape of a parallelogram.

5. The light emitting device of claim 1, wherein, along a direction of the optical axis of the at least one lens surface, a distance between the first plane and the second plane is not less than 50 μm and not more than 100 μm.

6. The light emitting device of claim 1, wherein, in the top view, a distance between the first light emission point and the second light emission point along a direction that is perpendicular to a direction of the optical axis of the at least one lens surface is not less than 100 μm and not more than 150 μm.

7. The light emitting device of claim 1, wherein:
the plurality of light emitting elements further include a third light emitting element configured to emit third light so as to pass through the at least one lens surface, the third light having an emission peak at a third wavelength from a third light emission point, the third wavelength being different from the first wavelength and the second wavelength, and the third light emission point being located farther from the lens member than the second plane; and in the top view, inside a region surrounded by the second plane, a third plane that is perpendicular to the optical axis of the at least one lens surface and that passes through the third light emission point, the second line, and a third line that is parallel to the optical axis of the at least one lens surface and that passes through the third light emission point, the outer edge of the upper face of the submount further passes through a point that is farther from the lens member than the second plane and that is closer to the lens member than the third plane.

8. The light emitting device of claim 7, wherein the first light emitting element is configured to emit blue light, the second light emitting element is configured to emit green light, and the third light emitting element is configured to emit red light.

9. The light emitting device of claim 7, wherein the second light emitting element is configured such that the second light includes light traveling on the optical axis of the at least one lens surface.

10. The light emitting device of claim 7, wherein, along a direction of the optical axis of the at least one lens surface, a distance between the first plane and the third plane is not less than 50 μm and not more than 100 μm.

* * * * *